US008161310B2

(12) United States Patent
Cagno et al.

(10) Patent No.: US 8,161,310 B2
(45) Date of Patent: Apr. 17, 2012

(54) EXTENDING AND SCAVENGING SUPER-CAPACITOR CAPACITY

(75) Inventors: Brian J. Cagno, Tucson, AZ (US); John C. Elliott, Tucson, AZ (US); Robert A. Kubo, Tuscon, AZ (US); Gregg S. Lucas, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 759 days.

(21) Appl. No.: 12/099,373

(22) Filed: Apr. 8, 2008

(65) Prior Publication Data
US 2009/0254772 A1    Oct. 8, 2009

(51) Int. Cl.
G06F 11/30    (2006.01)
(52) U.S. Cl. .......................................... 713/340
(58) Field of Classification Search .................. 713/324
See application file for complete search history.

(56) References Cited

U.S. PATENT DOCUMENTS

| 4,974,118 | A | * | 11/1990 | Rounds ........................ 361/311 |
|---|---|---|---|---|
| 5,262,999 | A | | 11/1993 | Etoh et al. |
| 5,430,674 | A | | 7/1995 | Javanifard |
| 5,438,549 | A | | 8/1995 | Levy |
| 5,496,939 | A | | 3/1996 | Maruyama |
| 5,555,371 | A | | 9/1996 | Duyanovich et al. |
| 5,644,531 | A | | 7/1997 | Kuo et al. |
| 5,661,349 | A | | 8/1997 | Luck |
| 5,732,238 | A | | 3/1998 | Sarkozy |
| 5,793,776 | A | | 8/1998 | Qureshi et al. |
| 5,944,837 | A | | 8/1999 | Talreja et al. |
| 6,016,472 | A | | 1/2000 | Ali |
| 6,236,593 | B1 | | 5/2001 | Hong et al. |
| 6,282,670 | B1 | | 8/2001 | Rezaul Islam et al. |
| 6,378,033 | B1 | | 4/2002 | Nishikawa |
| 6,496,939 | B2 | * | 12/2002 | Portman et al. ............... 713/340 |
| 6,658,435 | B1 | | 12/2003 | McCall |
| 6,680,548 | B2 | | 1/2004 | Shiue et al. |

(Continued)

FOREIGN PATENT DOCUMENTS
JP    2000-194607    7/2000
(Continued)

OTHER PUBLICATIONS

"Method and Procedure to Minimize Peak Power Load During Backup of Volatile Memory with Flash Memory Devices", IBM Technical Disclosure, http://www.ip.com/pubview/IPCOM000167428D, Feb. 13, 2008, 6 pages.

(Continued)

*Primary Examiner* — Chun-Kuan Lee
*Assistant Examiner* — Getente A Yimer
(74) *Attorney, Agent, or Firm* — Stephen R. Tkaes; Stephen J. Walder, Jr.; Randall J. Bluestone

(57) ABSTRACT

A memory system has mechanisms for scavenging capacity of a super capacitor by removing, or reducing, system load from the super capacitor when the super capacitor voltage decays below a low threshold. The mechanisms then restore the system load to the super capacitor when the super capacitor voltage ramps back above a high threshold. A controller may reduce system load by placing a volatile memory system in a standby state and disabling a field effect transistor to remove power from a non-volatile memory system. A controller may adjust the high threshold and/or a low threshold by setting a digitally controlled potentiometer in a threshold detect circuit via an $I^2C$ bus.

18 Claims, 4 Drawing Sheets

U.S. PATENT DOCUMENTS

| | | | |
|---|---|---|---|
| 6,785,786 | B1 | 8/2004 | Gold et al. |
| 7,143,298 | B2 | 11/2006 | Wells et al. |
| 7,315,951 | B2 * | 1/2008 | Hanrieder et al. ............ 713/300 |
| 7,451,348 | B2 | 11/2008 | Pecone et al. |
| 8,037,380 | B2 | 10/2011 | Cagno et al. |
| 8,040,750 | B2 | 10/2011 | Cagno et al. |
| 2002/0029354 | A1 | 3/2002 | Forehand et al. |
| 2002/0049917 | A1 | 4/2002 | Portman et al. |
| 2004/0052502 | A1 | 3/2004 | Komatsu et al. |
| 2004/0218434 | A1 | 11/2004 | Hwang et al. |
| 2004/0224192 | A1 | 11/2004 | Pearson |
| 2005/0010838 | A1 | 1/2005 | Davies et al. |
| 2005/0063217 | A1 | 3/2005 | Shiraishi et al. |
| 2005/0283648 | A1 | 12/2005 | Ashmore |
| 2006/0015683 | A1 | 1/2006 | Ashmore et al. |
| 2006/0047985 | A1 | 3/2006 | Otani |
| 2006/0108875 | A1 | 5/2006 | Grundmann et al. |
| 2006/0212644 | A1 | 9/2006 | Acton et al. |
| 2006/0248269 | A1 | 11/2006 | Shona |
| 2006/0255746 | A1 * | 11/2006 | Kumar et al. ............. 315/209 R |
| 2006/0259756 | A1 | 11/2006 | Thompson et al. |
| 2006/0264188 | A1 | 11/2006 | Mars et al. |
| 2007/0002675 | A1 | 1/2007 | Koo |
| 2007/0033433 | A1 | 2/2007 | Pecone et al. |
| 2007/0133277 | A1 | 6/2007 | Kawai et al. |
| 2007/0180184 | A1 | 8/2007 | Sakashita et al. |
| 2008/0016385 | A1 | 1/2008 | Hollingsworth et al. |
| 2008/0086615 | A1 | 4/2008 | Elliott et al. |
| 2008/0201622 | A1 | 8/2008 | Hiew et al. |
| 2009/0323452 | A1 | 12/2009 | Cagno et al. |
| 2009/0327578 | A1 | 12/2009 | Cagno et al. |
| 2010/0011261 | A1 | 1/2010 | Cagno et al. |
| 2010/0052625 | A1 | 3/2010 | Cagno et al. |

FOREIGN PATENT DOCUMENTS

| | | |
|---|---|---|
| JP | 2002-312250 | 10/2002 |

OTHER PUBLICATIONS

U.S. Appl. No. 12/145,969, filed Jun. 25, 2008, Cagno et al.
U.S. Appl. No. 12/146,098, filed Jun. 25, 2008, Cagno et al.
U.S. Appl. No. 12/204,456, filed Sep. 4, 2008, Cagno et al.
U.S. Appl. No. 12/169,273, filed Jul. 8, 2008, Cagno et al.
"Patented Wear Leveling", BitMicro Networks, http://www.bitmicro.com/products_edisk_features_wearlevel.php, printed Jul. 8, 2008, 2 pages.
USPTO U.S. Appl. No. 12/145,969.
USPTO U.S. Appl. No. 12/146,098.
USPTO U.S. Appl. No. 12/169,273.
USPTO U.S. Appl. No. 12/204,456.
Kim, Jesung et al., "A Space-Efficient Flash Translation Layer for CompactFlash Systems", IEEE Transactions on Consumer Electronics, May 2002, vol. 48, No. 2, pp. 366-375.
Thomasian, Alexander , "Priority Queueing in Raid5 Disk Arrays with an NVS Cache", Modeling, analysis, and Simulation of Computer and Telecommunication Systems, 1995. MASCOTS '95., Proceedings of the Third International Workshop on, vol., No., pp. 168-172, Jan. 18-20, 1995 doi: 10.1109/MASCOT.1995.378692.
Varma, Anujan et al., "Destage Algorithms for Disk Arrays with Nonvolatile Caches", Computers, IEEE Transactions on, vol. 47, No. 2, pp. 228-235, Feb. 1998 doi: 10.1109/12.663770, URL: http://ieeexplore.ieee.org/stamp/stamp.jsp?tp=&arnumber=663770&isnumber=14539.
Interview Summary mailed Apr. 28, 2011 for U.S. Appl. No. 12/169,273; 3 pages.
Response to Office Action filed with the USPTO on Apr. 29, 2011, U.S. Appl. No. 12/169,273, 10 pages.
Response to Office Action filed with the USPTO on Mar. 24, 2011 for U.S. Appl. No. 12/145,969; 19 pages.
Response to Office Action filed with the USPTO on May 24, 2011 for U.S. Appl. No. 12/146,098, 15 pages.
"Using Compression to Expedite Hardening Process of a Non-Volatile Memory DIMM System", IBM Technical Disclosure, http://www.ip.com/pubreview/IPCOM000167472D, Feb. 15, 2008, 4 pages.
Appeal Brief filed Nov. 30, 2011 for U.S. Appl. No. 12/146,098, 24 pages.
Interview Summary mailed Sep. 30, 2011 for U.S. Appl. No. 12/146,098, 3 pages.
Notice of Allowance mailed Sep. 2, 2011 for U.S. Appl. No. 12/204,456, 15 pages.
Final Office Action mailed Jul. 28, 2011 for U.S. Appl. No. 12/146,098, 19 pages.
Notice of Allowability mailed Jun. 13, 2011 for U.S. Appl. No. 12/169,273, 3 pages.
Notice of Allowance mailed Jun. 9, 2011 for U.S. Appl. No. 12/145,969, 18 pages.
Notice of Allowance mailed Jun. 9, 2011 for U.S. Appl. No. 12/169,273, 9 pages.
Supplemental Notice of Allowability mailed Jul. 29, 2011 for U.S. Appl. No. 12/145,969, 11 pages.
US 7,278,054, 10/2007, Davies et al. (withdrawn)

* cited by examiner

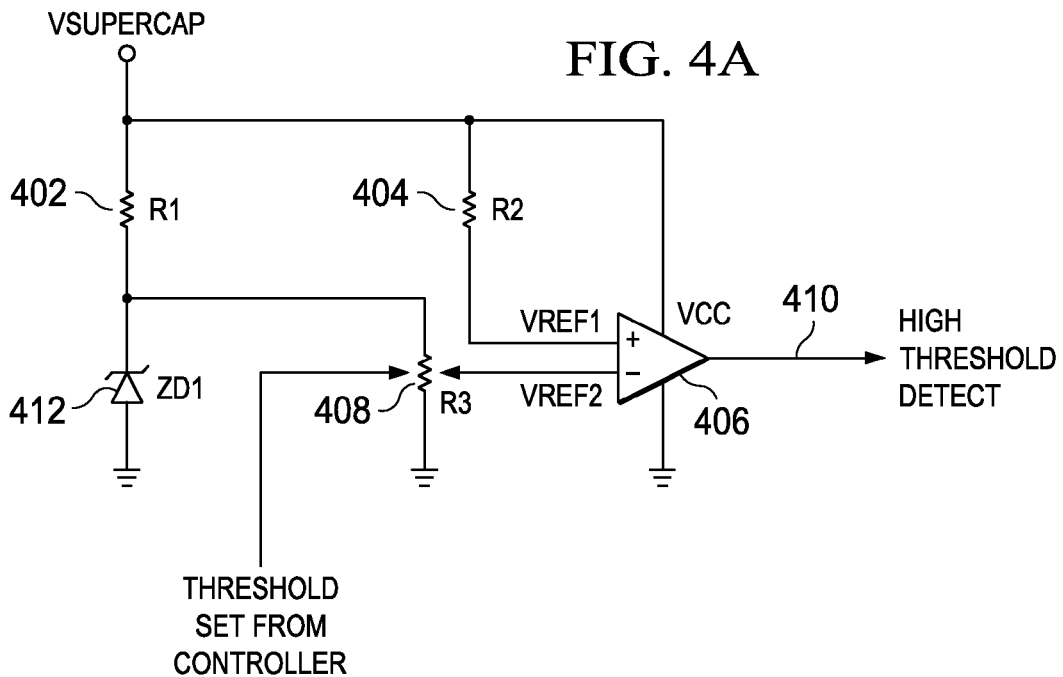
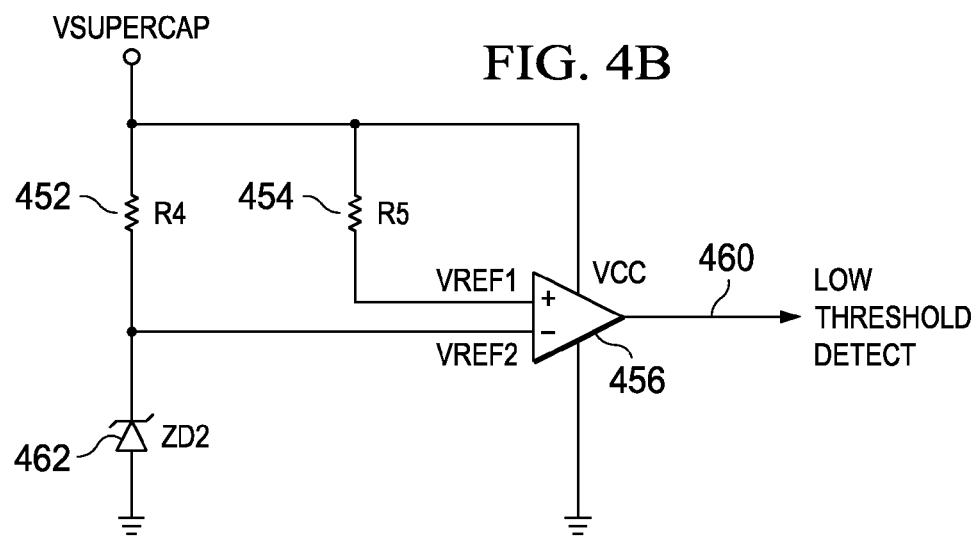

EXTENDING AND SCAVENGING SUPER-CAPACITOR CAPACITY

BACKGROUND OF THE INVENTION

1. Field of the Invention

The present application relates generally to an improved memory module with non-volatile memory system and extending and scavenging super-capacitor capacity.

2. Background of the Invention

A storage area network (SAN) is a network of storage disks. In large enterprises, a SAN connects multiple servers, or hosts, to a centralized pool of disk storage. Compared to managing hundreds of servers, each with its own disks, a SAN improves system administration. By treating all the company's storage as a single resource, disk maintenance and routine backups are easier to schedule and control. In some SANs, the disks themselves can copy data to other disks for backup without any processing overhead at the host computers.

A storage system typically comprises a plurality of storage devices and a storage controller in an enclosure. The storage controller may be a redundant array of independent disks (RAID) controller, for example. The storage controller receives host input/output (I/O) traffic to read and write data to the disk drives. The storage controller then reads data from or persists data to the disk drives via device I/O traffic. In storage systems, data is temporarily stored in volatile memory, such as Double Data Rate (DDR) Random Access Memory (RAM), due to the extremely fast access speeds that are required to meet maximum throughput to the disk drives.

BRIEF SUMMARY OF THE INVENTION

In one illustrative embodiment, a computer program product is provided comprising a computer recordable medium having a computer readable program recorded thereon. The computer readable program, when executed on a computing device, causes the computing device to transition to backup mode, reduce system load on the hold-up voltage source responsive to a voltage level of the hold-up voltage source dropping below a low threshold, and restore the system load on the hold-up voltage source and continuing operation of the backup mode responsive to the voltage level of the hold-up voltage source ramping up to a high threshold.

In another illustrative embodiment, a method, in a data processing system, is provided for scavenging hold-up voltage source capacity. The method comprises transitioning to a backup mode responsive to a power event, reducing system load on the hold-up voltage source responsive to a voltage level of the hold-up voltage source dropping below a low threshold, and restoring the system load on the hold-up voltage source and continuing operation of the backup mode responsive to the voltage level of the hold-up voltage source ramping up to a high threshold.

In another illustrative embodiment, a memory system comprises a controller, a volatile memory, a non-volatile memory, and a hold-up voltage source. The controller is configured to detect a power event from a power supply that provides power to a storage controller and the memory system. The hold-up voltage source is configured to provide power to the memory system responsive to the power event. The controller is configured to transition to memory backup mode to store data from the volatile memory to the non-volatile memory using power provided by the hold-up voltage source responsive to the power event, reduce system load on the hold-up voltage source responsive to a voltage level of the hold-up voltage source dropping below a low threshold, and restore the system load on the hold-up voltage source and continuing operation of the backup mode responsive to the voltage level of the hold-up voltage source ramping up to a high threshold.

These and other features and advantages of the present invention will be described in, or will become apparent to those of ordinary skill in the art in view of, the following detailed description of the exemplary embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIGS. 4A and 4B illustrate threshold detect and control circuits in accordance with an illustrative embodiment.

DETAILED DESCRIPTION OF THE INVENTION

The illustrative embodiments provide a mechanism to extend the useful charge capacity of a super-capacitor. The mechanism periodically switches the super-capacitor's load on and off. This allows the super-capacitor to recover from constant discharge conditions. The on/off times are based on the total load, operating voltage of interest, and super-capacitor characteristics. Predetermined switch points may be implemented to maintain the operating voltage level as long as possible.

Figure 1:
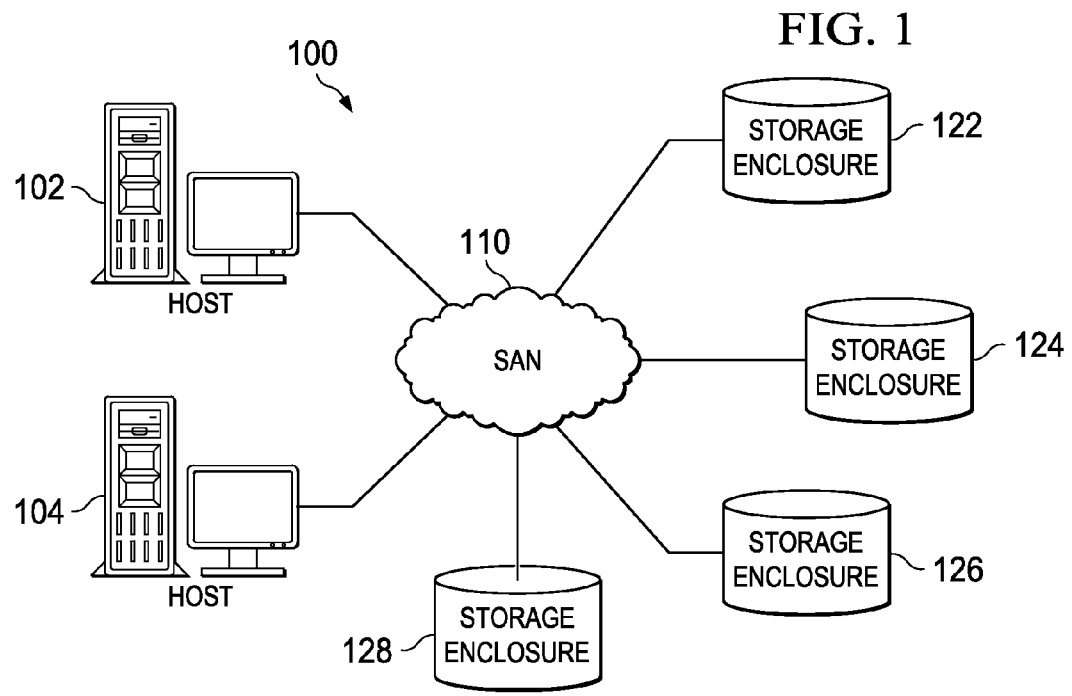
FIG. 1 depicts a pictorial representation of an exemplary distributed data processing system in which aspects of the illustrative embodiments may be implemented.
Figure 2:
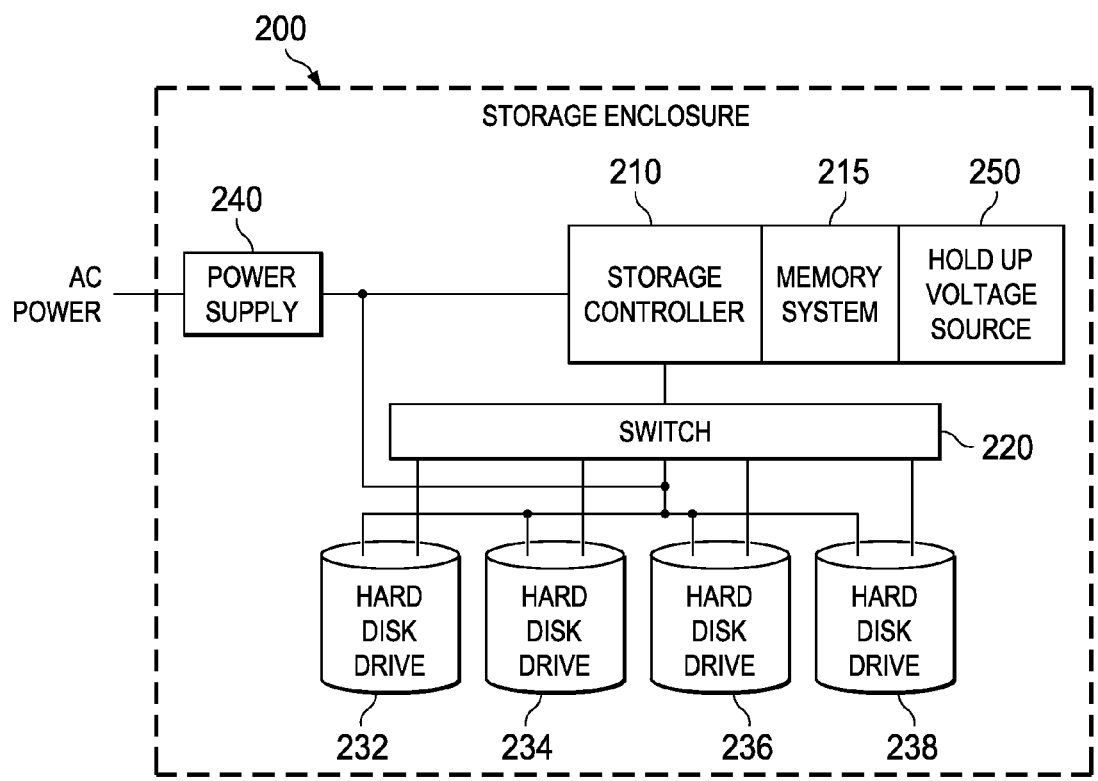
FIG. 2 is a block diagram depicting an exemplary storage enclosure in accordance with an illustrative embodiment.

The illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as exemplary environments in which exemplary aspects of the illustrative embodiments may be implemented. While the description following FIGS. 1 and 2 will focus primarily on a storage enclosure implementation, this is only exemplary and is not intended to state or imply any limitation with regard to the features of the present invention. To the contrary, the illustrative embodiments are intended to include any embodiments in which a super-capacitor is used to temporarily hold up voltage for components.

With reference now to the figures and in particular with reference to FIGS. 1 and 2, exemplary diagrams of data processing environments are provided in which illustrative embodiments of the present invention may be implemented. It should be appreciated that FIGS. 1 and 2 are only exemplary and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an exemplary distributed data processing system in which aspects of the illustrative embodiments may be implemented. Distributed data processing system 100 may include a network of computers in which aspects of the illustrative embodiments may be implemented. The distributed data processing system 100 contains at least one storage area network 110, which is the medium used to provide communication links between various devices and computers, such as host computers and storage enclosures, connected together within distributed data processing system 100. Storage area network 110 may include connections, such as wire, wireless communication links, serial attached small computer systems interface (serial attached SCSI or SAS) switches, or fiber optic cables.

In the depicted example, host computer 102 and host computer 104 are connected to storage area network (SAN) 110 along with storage enclosures 122, 124, 126, and 128. A storage enclosure includes a storage controller and connection to one or more hard disk drives. The storage controller may be a simple controller for storing data to the hard disk drives, or alternatively may include a redundant array of independent disks (RAID) controller. Distributed data processing system 100 may include additional hosts, storage enclosures, clients, and other devices not shown.

In the depicted example, SAN 110 may use the Transmission Control Protocol/Internet Protocol (TCP/IP) suite of protocols to communicate with one another; however, more likely, SAN 110 may use a protocol associated with Fibre Channel (FC) or Serial attached SCSI (SAS). As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram depicting an exemplary storage enclosure in accordance with an illustrative embodiment. Storage enclosure 200 comprises storage controller 210, which may be a redundant array of independent disks (RAID) controller or a non-RAID controller. Storage controller 210 communicates with hard disk drives (HDDs) 232, 234, 236, and 238 through switch 220. Switch 220 may be, for example, a serial attached SCSI (SAS) switch. Other devices in a storage area network (SAN) may write data to or read data from storage enclosure 200 by connection to switch 220.

Storage controller 210 may store data temporarily in memory system 215 before persisting the data to HDDs 232-238. Memory system 215 may comprise a Double Data Rate (DDR) memory system that provides fast access speeds to meet required maximum throughput to HDDs 232-238. DDR memory is a volatile memory.

Power supply 240 receives alternating current (AC) power and provides direct current (DC) power to the components within storage enclosure 200. More particularly, power supply 240 provides DC power to storage controller 210, memory system 215, switch 220, and HDDs 232-238. If AC power to storage enclosure 200 is lost or interrupted, then there is a data integrity exposure within memory system 215.

One approach to solving data integrity exposure due to power failure is to hold up power to the entire enclosure using battery power while the data is written to disk. This approach requires very large and expensive uninterruptible power supply (UPS) units. Another approach involves using a small battery and placing the memory into self refresh mode. Typically, a battery may allow the volatile memory to hold data for 72 hours. Even this battery can become large and expensive. Both solutions require chemical batteries to be used, which can also create safety hazards if not used or disposed of properly.

In accordance with an illustrative embodiment, memory system 215 includes a non-volatile storage element that is used to save data from the volatile memory when power is lost and a hold up voltage source 250 that is used to hold up the voltage while the data is saved to non-volatile storage.

Figure 3:
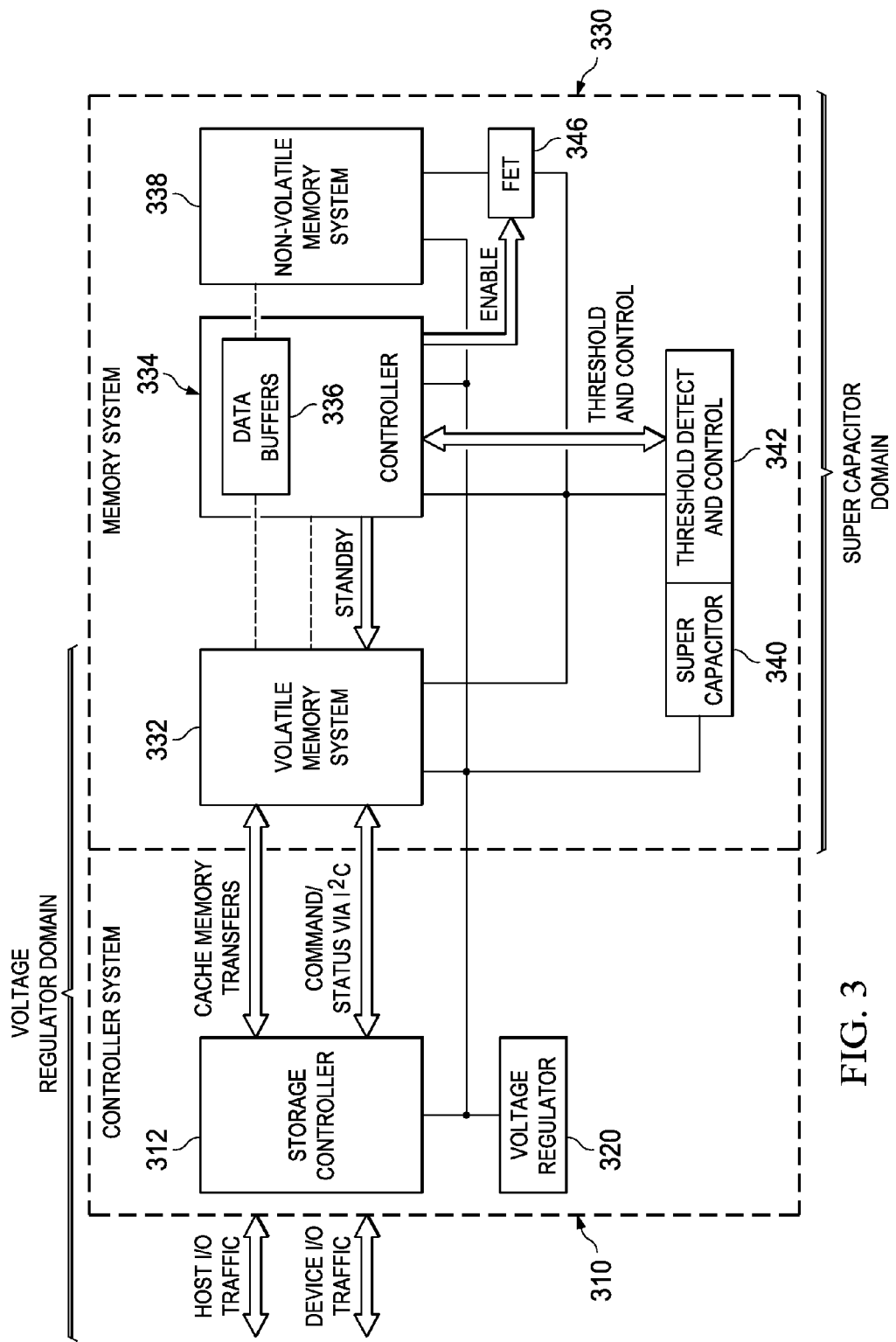
FIG. 3 is a block diagram illustrating a controller system and memory system in accordance with an illustrative embodiment

FIG. 3 is a block diagram illustrating a controller system and memory system in accordance with an illustrative embodiment. Controller system 310 comprises storage controller 312 and voltage regulator 320. Controller system 310 receives host input/output (I/O) traffic to load data to or store data from the host. Controller system 310 also receives device I/O traffic to store data to or load data from storage devices. Storage controller 312 temporarily stores data in volatile memory system 332 within memory system 330 via cache memory transfers. Storage controller 312 also performs commands and updates status information using an inter-integrated circuit (I2C) bus.

Memory system 330 comprises volatile memory system 332, non-volatile memory system 338, controller 334, and super capacitor 340. Volatile memory system 332 may be a Double Data Rate (DDR) memory, for example. Non-volatile memory system 338 may be a flash memory, for example. Controller 334 stores data from volatile memory system 332 to non-volatile memory system 338. Controller 334 may store data temporarily in data buffers 336 as data is transferred to non-volatile memory system 338.

Voltage regulator 320 provides direct current (DC) power to storage controller 312, volatile memory system 332, controller 334, and non-volatile memory system 338. Voltage regulator 320 may provide a voltage in the range of 3.0V to 3.5V, such as 3.3V, for example. However, the voltage may be higher or lower depending on the implementation. Voltage regulator 320 also provides DC power to charge super capacitor 340 to the normal voltage limit. Responsive to normal power being lost from voltage regulator 320, super capacitor 340 becomes the source of power for volatile memory system 332, controller 334, and non-volatile memory system 338.

As memory system 330 hardens the data (transfers the data from volatile memory system 332 to non-volatile memory system 338), super capacitor 340 begins to discharge. At some point, the voltage provided by super capacitor 340 begins to decay as a function of the load. When the voltage of super capacitor 340 falls below the minimum voltage requirement of memory system 330, operation may become nondeterministic and failures may occur.

In accordance with an illustrative embodiment, several mechanisms may be deployed to extend the usefulness of super capacitor 340. A mechanism may charge pump super capacitor 340 to a voltage that is higher than the operating voltage of memory system 330. The mechanism may use a buck/boost voltage regulator combination (not shown) to regulate the voltage down from the charge pumped voltage as well as boost the super capacitor voltage to a usable limit when the voltage decays below a minimum threshold.

In one illustrative embodiment, to extend the useful charge capacity of a super capacitor, threshold detect and control element 342 and controller 334 periodically reduce the load on super capacitor 340. When a super capacitor continuously supplies power to a load, the output voltage level decays at a fairly linear rate. If the load is removed prior to decaying all way to zero volts, the super capacitor output voltage ramps back up to a voltage level much higher than the level to which it was previously loaded. This ramp back level is a function of the previously loaded power discharge rate as well as the previous voltage level that was reached at the time of the load switching.

These three mechanisms extend the usefulness of a super capacitor charge state. For example, a super capacitor may be charged to a specific voltage level, such as 5.0V. If a constant load is applied, the super capacitor discharges at a fairly constant rate and also linearly decreases its output voltage level correspondingly. At some point, such as 3.0V, the output voltage level no longer supports the minimum voltage level of the memory system and the system will not be able to guarantee proper operation.

The illustrative embodiment disconnects the load from the super capacitor at a predetermined point on the voltage down ramp (e.g., 3.0V) and waits a predetermined amount of time to allow the super capacitor's memory effect to recover from the discharge period and return to a higher output voltage (e.g., 4.5V). The load may then be reconnected and the cycle continues. Each time the cycle repeats, the mechanism may change the predetermined switch points.

Thus, reducing load on super capacitor 340 allows super capacitor 340 to recover from constant discharge conditions, which results in the voltage itself recovering. When the voltage from super capacitor 340 springs back above a predetermined level, threshold detect and control element 342 and controller 334 place the full load back on super capacitor 340 to continue to harden data from volatile memory system 332 to non-volatile memory system 338.

Volatile memory system 332 may run in a standby mode, which runs at a low current, thus placing a low load on super capacitor 340. DDR memories that have a low-current, low-load standby mode are known in the art. When in standby mode, volatile memory system 332 maintains storage of the data contents, thus maintaining data integrity. Controller 334 may operate at a very low current, such as 1 mA to 2 mA, thus presenting a low load to super capacitor 340. Non-volatile memory system 338 presents a much higher load to super capacitor 340 than controller 334 and volatile memory system 332 running in standby mode. Furthermore, because memory system 338 is non-volatile, removing power from non-volatile memory system 338 does not result in any loss of data. Therefore, placing volatile memory system 332 into standby mode and removing power from non-volatile memory system 338 results in essentially removing any significant load from super capacitor 340.

In an alternative embodiment, a mechanism may switch the load off by holding the volatile memory and the non-volatile memory in a reset condition, which significantly reduces their power consumption.

Threshold detect and control element 342 detects when the voltage provided by super capacitor 340 falls below a predetermined low threshold. Threshold detect and control element 342 communicates threshold and control signals to controller 334. Controller 334 then may place volatile memory system 332 into standby mode and disable field effect transistor (FET) 346, thus removing power from non-volatile memory system 338 and essentially removing any significant load from super capacitor 340. Without the significant load pulling the voltage of super capacitor 340 down, the voltage of super capacitor 340 will then spring back up to a degree.

Threshold detect and control element 342 then detects when the voltage provided by super capacitor 340 exceeds a predetermined high threshold. Threshold detect and control element 342 then communicates that the voltage provided by super capacitor 340 is above the high threshold to controller 334. Controller 334 may then de-assert the standby signal to volatile memory system 332, thus allowing volatile memory system 332 to operate fully, and enable FET 346, thus providing power to non-volatile memory system 338.

FIGS. 4A and 4B illustrate threshold detect and control circuits in accordance with an illustrative embodiment. In one exemplary embodiment, the high threshold may be adjustable, because each time the threshold detect and control element and controller remove load from the super capacitor, the voltage will ramp back up to a lower voltage until the super capacitor does not have any usability left. Thus, the controller may adjust the high threshold to detect a lower voltage after each iteration. In an alternative embodiment, both the high threshold and the low threshold may be adjustable.

More particularly, FIG. 4A illustrates an adjustable threshold detect circuit that may be used for a high threshold detect or a low threshold detect in accordance with an illustrative embodiment. The voltage from the super capacitor, Vsupercap, is received as the supply voltage, Vcc, at comparator 406. Comparator 406 may be, for example, a differential amplifier. Vsupercap is also received at resistor R2 404. Current flows from Vsupercap through R2 404 to a first input of comparator 406. The voltage at the first input of comparator 406 is Vref1, which is Vsupercap minus the drop across R2 404. Comparator 406 compares Vref1 to a threshold voltage. Vsupercap is also received at resistor R1 402, which is connected to Zener diode ZD1 412. A Zener diode is a type of diode that permits current to flow in the forward direction like a normal diode, but also in the reverse direction if the voltage is larger than the breakdown voltage known as the "Zener voltage." Current flows from Vsupercap through R1 402 and ZD1 412 to ground. Thus, the voltage across ZD1 412 remains equal to the Zener voltage.

R1 402 is also connected to a first terminal of resistor R3 408, which is a digitally controlled potentiometer (DCP), also known as a digipot. A second terminal of R3 408 is connected to ground. A potentiometer is a variable tapped resistor that acts as a voltage divider. A DCP allows small adjustments to be made by software, instead of by mechanical adjustments. Because this type of control is updated only infrequently, a DCP often has a slow serial interface, like $I^2C$. The controller sets the high threshold voltage by making adjustments to R3 408. The third terminal of R3 408 is connected to a second input of comparator 406. Current flows from Vsupercap through R1 402 and R3 408 to ground. The voltage at the second input of comparator 406 is the Zener voltage of ZD1 412 minus a portion of the voltage across R3 408, the portion being adjustable by the controller via an $I^2C$ bus.

The values of R1 402, R2 404, R3 408, and ZD1 412 are determined based on a desired range of high threshold values. The tap of the third terminal of R3 408, and, thus, Vref2, is set to adjust the high threshold value. When Vref1 is greater than Vref2, the output of comparator 406, the high threshold detect signal 410, is asserted. When Vref1 is less than Vref 2, high threshold detect signal 410 is de-asserted.

FIG. 4B illustrates a threshold detect circuit that may be used for a low threshold detect in accordance with an illustrative embodiment. The voltage from the super capacitor, Vsupercap, is received as the supply voltage, Vcc, at comparator 456. Comparator 456 may be, for example, a differential amplifier. Vsupercap is also received at resistor R5 454. Current flows from Vsupercap through R5 454 to a first input of comparator 456. The voltage at the first input of comparator 456 is Vref1, which is Vsupercap minus the drop across R5 454.

Vsupercap is also received at resistor R4 452, which is connected to Zener diode ZD2 462. Current flows from Vsupercap through R4 452 and ZD2 462 to ground. R4 452 is also connected to a second input of comparator 456. The voltage at the second input of comparator 456 is the Zener voltage of ZD2 462. The values of R4 452, R5 454, and ZD2 462 are determined based on a desired low threshold value. When Vref1 is greater than Vref2, the output of comparator 456, the low threshold detect signal 460, is asserted. When Vref1 is less than Vref 2, low threshold detect signal 460 is de-asserted. Thus, low threshold detect signal 460 being de-asserted serves as an indication that Vsupercap falls below the low threshold voltage.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer. In the latter scenario, the remote computer may be connected to the user's computer through any type of network, including a local area network (LAN) or a wide area network (WAN), or the connection may be made to an external computer (for example, through the Internet using an Internet Service Provider).

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 5:
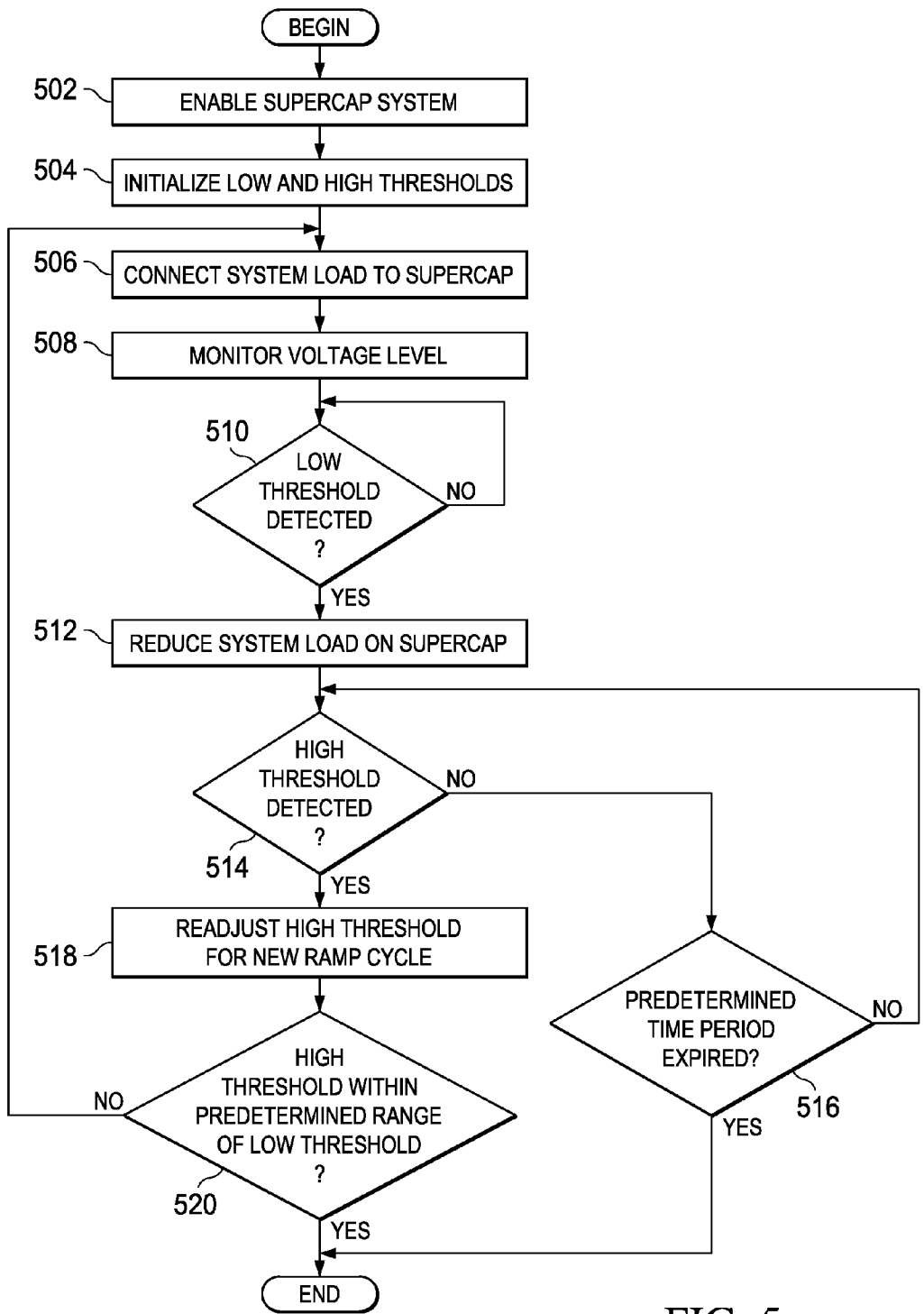
FIG. 5 provides a flowchart outlining exemplary operations of a mechanism to scavenge super capacitor capacity in accordance with an illustrative embodiment.

FIG. 5 provides a flowchart outlining exemplary operations of a mechanism to scavenge super capacitor capacity in accordance with an illustrative embodiment. Operation begins, and the mechanism enables the super capacitor system to provide power (block 502). The mechanism may enable the super capacitor responsive to a power event, such as an early power off warning. Then, the mechanism initializes low and high thresholds (block 504). In one exemplary embodiment, as illustrated in FIG. 4A, a controller sets the high threshold by setting a digitally controlled potentiometer (DCP) via an $I^2C$ bus.

The mechanism connects the system load to the super capacitor (block 506). In one exemplary embodiment, as illustrated in FIG. 3, the controller connects the load by placing the volatile memory system in a non-standby state and enabling a field effect transistor (FET), which provides power to a non-volatile memory system.

Thereafter, the mechanism monitors the voltage level of the super capacitor (block 508). The mechanism detects whether the super capacitor voltage drops to or below a low threshold (block 510). In one exemplary embodiment, as illustrated in FIG. 4B, a threshold detect circuit uses a comparator to determine whether the super capacitor voltage drops below a predetermined low threshold voltage. In an alternative embodiment, a threshold detect circuit, such as that shown in FIG. 4A, may be used to provide an adjustable low threshold voltage.

If the super capacitor voltage does not fall below the low threshold voltage, operation returns to block 510 until the decaying super capacitor voltage falls below the low threshold. When the super capacitor voltage falls below the low threshold in block 510, the mechanism reduces the system load on the super capacitor (block 512). In one exemplary embodiment, as illustrated in FIG. 3, the controller reduces the load on the super capacitor by placing the volatile memory system in a standby state and disabling the FET to remove power from the non-volatile memory system.

The mechanism determines whether the super capacitor voltage ramps back above a high threshold (block 514). If the super capacitor voltage does not ramp back above the high threshold voltage, the controller determines whether a predetermined time period expires (block 516). If the predetermined time period does not expire, operation returns to block 514 until the super capacitor voltage rises above the high threshold in block 514 or the predetermined time period expires in block 516. If the predetermined time period expires in block 516, operation ends.

When the super capacitor voltage rises above the high threshold in block 514, the mechanism readjusts the high threshold for a new ramp cycle (block 518). In one exemplary embodiment, as shown in FIG. 4A, a controller adjusts the high threshold by setting a digitally controlled potentiometer (DCP) via an I²C bus. Then, the mechanism determines whether the high threshold is within a predetermined range of the low threshold (block 520). For example, the controller may determine whether the high threshold is equal to the low threshold. If the high threshold is within a predetermined range of the low threshold, operation ends. If the high threshold is not within the predetermined range of the low threshold in block 520, then operation returns to block 508 to monitor the super capacitor voltage.

Thus, the illustrative embodiments provide mechanisms for scavenging capacity of a super capacitor by removing, or reducing, system load from the super capacitor when the super capacitor voltage decays below a low threshold. The mechanisms then restore the system load to the super capacitor when the super capacitor voltage ramps back above a high threshold. A controller may reduce system load by placing a volatile memory system in a standby state and disabling a field effect transistor to remove power from a non-volatile memory system. A controller may adjust the high threshold and/or a low threshold by setting a digitally controlled potentiometer in a threshold detect circuit via an I²C bus.

As noted above, it should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer program product comprising a computer storage medium having a computer readable program stored thereon, wherein the computer readable program, when executed on a computing device, causes the computing device to:

initializing a low threshold and a high threshold;

responsive to an early power off warning, transition to backup mode and enable a super capacitor to provide power;

reducing system load on the super capacitor responsive to a voltage level of the super capacitor dropping below the low threshold;

restore the system load on the super capacitor and continue operation of the backup mode responsive to the voltage level of the super capacitor ramping up to the higher threshold;

reducing the system load on the super capacitor responsive to the voltage level of the super capacitor dropping below the low threshold subsequent to the previous restoring of the system load;

decrease the high threshold in response to repeating the reducing of the system load;

determine whether the high threshold is within a predetermined range of the low threshold; and stop operation of the backup mode responsive to the high threshold being within the predetermined range of the low threshold.

2. The computer program product of claim 1, wherein he computer readable program further causes the computing device to repeat restoring the system load on the super capacitor and continuing operation of the backup mode responsive to the voltage level of the super capacitor ramping up to the high threshold, reducing system load on the super capacitor responsive to the voltage level of the super capacitor dropping below the low threshold, and adjusting the high threshold until the high threshold is within a predetermined range of the low threshold.

3. The computer program product of claim 2, wherein the backup mode comprises a memory backup mode to store data from a volatile memory to a non-volatile memory using power provided by the super capacitor responsive to the early power off warning, and wherein reducing system load on the super capacitor comprises placing the volatile memory in a standby state.

4. The computer program product of claim 3, wherein restoring the system load on the super capacitor comprises placing the volatile memory in a non-standby state.

5. The computer program product of claim 2, wherein the backup mode comprises a memory backup mode to store data from a volatile memory to a non-volatile memory using power provided by the super capacitor responsive to the early power off warning, and wherein reducing system load on the super capacitor comprises disabling power to the non-volatile memory.

6. The computer program product of claim 5, wherein restoring the system load on the super capacitor comprises enabling power to the non-volatile memory.

7. A method, in a data processing system, for scavenging super capacitor capacity, the method comprising:
Initializing a low threshold and a high threshold;
responsive to an early power off warning, transition to backup mode and enabling a super capacitor to provide power;
responsive to a voltage level of the super capacitor dropping below the low threshold, reducing the system load on the super capacitor;
responsive to the voltage level of the super capacitor ramping up to a high threshold, restore the system load on the super capacitor and continuing operation of the backup mode;
reducing the system load on the super capacitor responsive to the voltage level of the super capacitor dropping below the low threshold subsequent to the previous restoring of the system load;
decrease the high threshold in response to repeating the reducing of the system load;
determining whether the high threshold is within a predetermined range of the low threshold; and
stopping operation of the backup mode responsive to the high threshold being within the predetermined range of the low threshold.

8. The method of claim 7, further comprising:
repeat restoring the system load on the super capacitor and continuing operation of the backup mode responsive to the voltage level of the super capacitor ramping up to the high threshold, reducing system load on the super capacitor responsive to the voltage level of the super capacitor dropping below the low threshold, and adjusting the high threshold until the high threshold is within a predetermined range of the low threshold.

9. The method of claim 7, wherein the backup mode comprises memory backup mode to store data from a volatile memory to a lion-volatile memory using power provided by the super capacitor responsive to the early power off warning, and wherein reducing system load on the super capacitor comprises placing the volatile memory in a standby state.

10. The method of claim 9, wherein restoring the system load on the super capacitor comprises placing, the volatile memory in a non-standby state.

11. The method of claim 7, wherein the backup mode comprises a memory backup mode to store data from a volatile memory to a non-volatile memory using power provided by the super capacitor responsive to the early power off warning, and wherein reducing system load on the super capacitor comprises disabling power to the non-volatile memory.

12. The method of claim 11, wherein restoring the system load on the super capacitor comprises enabling power to the non-volatile memory.

13. A memory system comprising:
a controller, wherein the controller is configure to detect a power event from a power supply the provides power to a storage controller and the memory system;
a volatile memory;
a non-volatile memory; and
a super capacitor, wherein the super capacitor is configured to provide power to the memory system response to the power event,
wherein the controller is configured to transition to memory backup mode to store data from the volatile memory to the non-volatile memory using power provided by the super capacitor responsive to the power event, reduce the system load on the super capacitor responsive to a voltage level of the super capacitor dropping below a low threshold, restore the system load on the super capacitor and continuing operation of the backup mode responsive to the voltage level of the super capacitor ramping up to a high threshold, reduce the system load on the super capacitor responsive to the voltage level of the super capacitor dropping below the low threshold subsequent to the previous restoring of the system load, decrease the high threshold in response to repeating the reducing of the system load, determine whether the high threshold is within a predetermined range of the low threshold, and stop operation of the backup mode responsive to the high threshold being within the predetermined range of the low threshold.

14. The memory system of claim 13, further comprising:
a low threshold detect circuit that generates a low threshold detect signal responsive to the voltage level of the hold-up voltage source dropping below a low threshold; and
a high threshold detect circuit that generates a high threshold detect signal responsive to the voltage level of the hold-up voltage source ramping up to the high threshold.

15. The memory system of claim 14, wherein the low threshold detect comprises:
a comparator that compares a first reference voltage to a second reference voltage, wherein the first reference voltage is derived from the voltage level of the hold-up voltage source and wherein the second reference voltage is derived from a Zener voltage of a Zener diode.

16. The memory system of claim 14, wherein the high threshold detect circuit comprises:
a comparator that compares a first reference voltage to a second reference voltage, wherein the first reference voltage is derived from the voltage level of the hold-up voltage source and wherein the second reference voltage is derived from a Zener voltage of a Zener diode using a voltage divider.

17. The memory system of claim 16, wherein the voltage divider comprises a digitally controlled potentiometer and wherein the controller sets the high threshold by setting the digitally controlled potentiometer.

18. The memory system of claim 13, wherein the controller is configured to:
repeat restoring the system load on the super capacitor and continuing operation of the backup mode responsive to the voltage level of the super capacitor ramping up to the high threshold, reducing system load on the super capacitor responsive to the voltage level of he super capacitor dropping below the low threshold, and adjusting the high threshold until the high threshold is within a predetermined range of the low threshold.

* * * * *